United States Patent
Tong et al.

(10) Patent No.: US 9,831,404 B2
(45) Date of Patent: Nov. 28, 2017

(54) LIGHT EMITTING DIODE PACKAGE

(71) Applicant: Lextar Electronics Corporation, Hsinchu (TW)

(72) Inventors: Hung-Chun Tong, New Taipei (TW); Yu-Chun Lee, Hsinchu County (TW)

(73) Assignee: LEXTAR ELECTRONICS CORPORATION, Hsinchu (TW)

( * ) Notice: Subject to any disclaimer, the term of this patent is extended or adjusted under 35 U.S.C. 154(b) by 0 days.

(21) Appl. No.: 15/344,578

(22) Filed: Nov. 6, 2016

(65) Prior Publication Data
US 2017/0148961 A1 May 25, 2017

(30) Foreign Application Priority Data
Nov. 23, 2015 (TW) .............................. 104138755 A

(51) Int. Cl.
*H01L 51/50* (2006.01)
*H01L 33/58* (2010.01)
*H01L 33/60* (2010.01)
*H01L 33/50* (2010.01)

(52) U.S. Cl.
CPC ............ *H01L 33/58* (2013.01); *H01L 33/507* (2013.01); *H01L 33/60* (2013.01); *H01L 51/50* (2013.01); *H01L 2224/48091* (2013.01)

(58) Field of Classification Search
CPC .............................. H01L 33/58; H01L 33/507
See application file for complete search history.

(56) References Cited

U.S. PATENT DOCUMENTS

2007/0012940 A1* 1/2007 Suh ..................... H01L 33/507
                                                              257/99
2011/0095319 A1* 4/2011 Kim ..................... H01L 33/56
                                                              257/98

FOREIGN PATENT DOCUMENTS

| CN | 102509759 | * | 1/2014 |
|----|-----------|---|--------|
| TW | 201308682 A |   | 2/2013 |
| TW | M448063 U1 |   | 3/2013 |
| TW | 201424051 A |   | 6/2014 |
| TW | 201530829 A |   | 8/2015 |

\* cited by examiner

*Primary Examiner* — Karen Kusumakar
(74) *Attorney, Agent, or Firm* — CKC & Partners Co., Ltd.

(57) ABSTRACT

A light emitting diode (LED) package includes a light element, a light transferring layer disposed on the light element, a packaging layer enclosing the light transferring layer, a white wall surrounding the packaging layer and a diffusion film disposed on the packaging layer. The light transferring layer has a light outlet face, a light inlet face opposite to the light outlet face and a peripheral side. The light inlet face faces the light element. The white wall surrounds the peripheral side that is enclosed by the packaging layer.

7 Claims, 4 Drawing Sheets

LIGHT EMITTING DIODE PACKAGE

RELATED APPLICATIONS

This application claims priority to Taiwanese Application Serial Number 104138755, filed on Nov. 23, 2015, which is herein incorporated by reference.

BACKGROUND

Field of Invention

The present invention relates to a light emitting diode packaging device. More particularly, the present disclosure relates to a light emitting diode packaging device having a white wall.

Description of Related Art

Conventional light emitting diode packaging structure uses blue light chip along with ceramic fluorescent film, fluorescent film or glass fluorescent film or any other light emitting material to achieve light transferring at different wavelength. The fluorescent film is disposed on the blue light chip. However, because the position of the fluorescent film, the colour temperatures of the normal (perpendicular to the fluorescent film) and lateral (parallel to the fluorescent film) side are different. The normal light has higher colour temperature, while the lateral light has a lower colour temperature. It leads to the blue-yellow ring light defect often seen in light emitting diode. The blue-yellow ring may be corrected by secondary optics design. However, optical design is related to the light emitting diode configuration, and the second optics has to be designed according to the light emitting diode. Therefore, the light emission uneven resulting from the colour temperature of the lateral light requires urgent attention is this field.

SUMMARY

In order to reduce colour temperature deviation from the lateral side in light emitting diode, the instant disclosure provides a light emitting diode package. The light emitting diode package includes a light element, a light transferring layer disposed on the light element, a packaging layer enclosing the light transferring layer, a white wall surrounding the packaging layer and a diffusion film disposed on the packaging layer. The light transferring layer has a light outlet face, a light inlet face opposite to the light outlet face and a peripheral side. The light inlet face faces the light element. The white wall surrounds the peripheral side that is enclosed by the packaging layer.

In the presence of the white wall that surrounds the peripheral side, the lateral light that is parallel to the light transferring layer can be reflected by the white wall such that light with lower colour temperature is less likely to leak, and emission light unevenness can be reduced. The white wall can be widely applicable to any light emitting diode without redesigning the structure of a light emitting diode, especially each light emitting diode has varied configurations.

It is to be understood that both the foregoing general description and the following detailed description are by examples, and are intended to provide further explanation of the invention as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1:
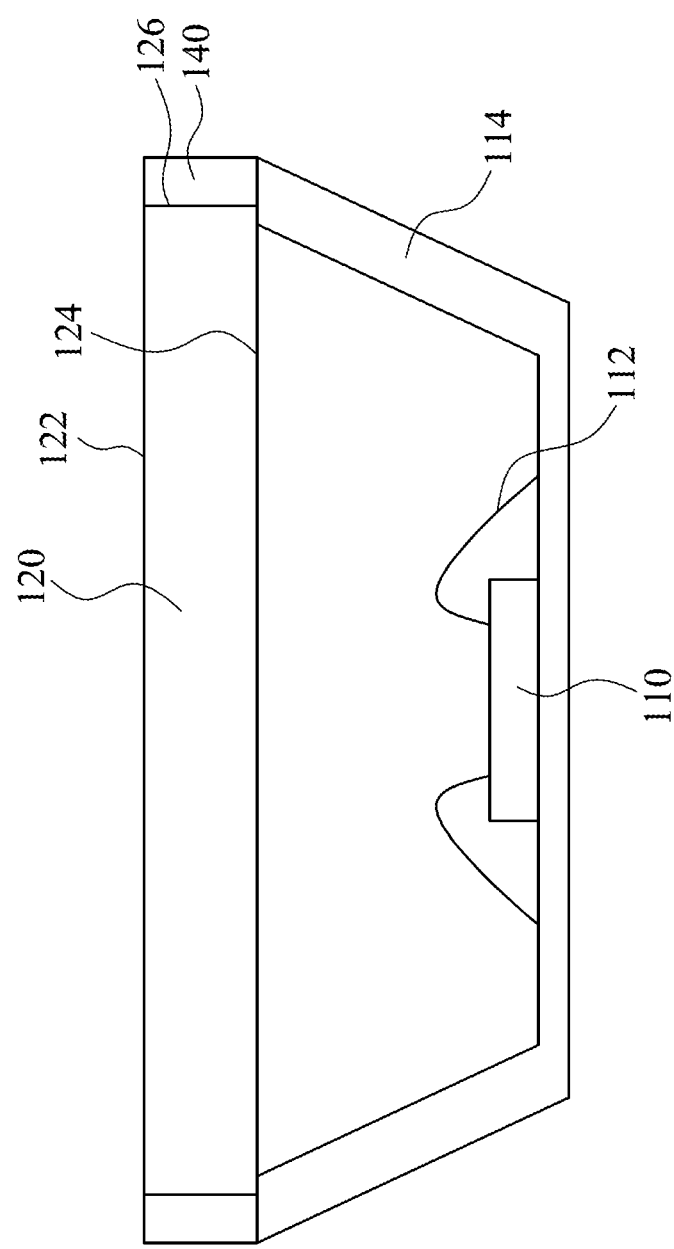
FIG. 1 is a cross-sectional elevation view of a light emitting diode package in accordance with an embodiment of the instant disclosure.

Reference will now be made in detail to the present embodiments of the invention, examples of which are illustrated in the accompanying drawings. Wherever possible, the same reference numbers are used in the drawings and the description to refer to the same or like parts.

Please refer to FIG. 1. FIG. 1 is a cross-sectional elevation view of a light emitting diode package 100 in accordance with an embodiment of the instant disclosure. The light emitting diode package 100 includes a light element 110, wires 112, a packaging cup 114, a light transferring layer 120 and a white wall 140. The light element 110 is a light emitting diode, for example, horizontal chip, perpendicular chip, flip chip, chips on board (COB), plastic leaded chip carrier (PLCC) or the like. The light emitting diode is electrically connected to the chip by wires 112 or any other suitable configuration. The light element 110 may be an organic light emitting diode.

The packaging cup 114 is a semi-opened carrier. The light element 110 is disposed on a bottom of the packaging cup 114. The sidewalls of the packaging cup 114 are slanting. The sidewalls expand away from the light element 110. The opening of the packaging cup 114 is larger than the bottom. The light transferring layer 120 is disposed on the packaging cup 114. The light transferring layer 120 has a light outlet face 122, a light inlet face 124 opposite to the light outlet face 122 and a peripheral side 126 that connects the light outlet and inlet faces 122, 124. The light inlet face 124 of the light transferring layer 120 faces a light emission side of the light emitting diode. The light transferring layer 120 has a light emitting material capable of light transferring. The light emitting material may be inorganic, for example, LuYAG, GaYAG, YAG, silicate, sulfide or nitride. Organic light emitting material may be a compound having one or more functional groups, for example, perylene, benzimidazole, naphthalene, anthracene, phenanthrene, fluorine, 9-fluorene, carbazole, glutarimide, 1,3-diphenylbenzene, benzopyrene, pyrene, pyridine, thiophene, and 2,3-dihydro-1H-benzo[de]isoqunoline-1,3-dione. The light transferring layer 120 may further include quantum dots (QDs). The quantum dots may be a CdSe, ZnS, ZnSe. The quantum dots may be $CsPb(Cl_aBr_{1-a-b}I_b)_3$, and a ranges between 0 and 1, and b ranges between 0 and 1. When a is larger than 0, b is equal to 0, and when b is larger than 0, a is equal to 0. The light transferring layer 120 seals the opening of the packaging cup 114 to form a closed space defined by the packaging cup 114 and the light transferring layer 120. In some embodiments of the instant disclosure, the closed space is empty without other filler. In some embodiments of the instant disclosure, the closed space may be filled with plastic polymer, for example, epoxy or silicon. The light source emitted by the emitting element 110 travels through the closed space, passes through the light transferring layer 120 and spreads out from the light outlet face 122.

In some embodiments of the instant disclosure, the white wall 140 of the light emitting diode package 100 is formed on the peripheral side 126 of the light transferring layer 120 and surrounds the light transferring layer 120. A height of the white wall 140 is equivalent to the thickness of the light transferring layer 120. The material of white wall 140 is capable of light reflection and prevents light leakage. Exemplary material includes glass, quartz, light reflection film and plastic polymer. Plastic polymer may be selected from polymethyl methacrylate (PMMA), polyethylene terephthalate (PET), polystyrene (PS), polypropylene (PP), polyamide (PA), polycarbonate (PC), epoxy, silicon or a combination thereof. The light reflection capability of the white wall 140 can be adjusted by adding other filling particles. The filling particles may be, for example, $TiO_2$, $SiO_2$, $Al_2O_3$, BN, ZnO or the like. The filling particles may be different size.

When the light emitting diode emits light, the propagation of light goes through the closed space and then the light transferring layer 120. As previously described, the propagation of light diverges. A portion of the light is perpendicular to the light transferring layer 120 and emitted from the light outlet face 122. A portion of the light is emitted through an angle smaller than 90° measured from the light transferring layer 120. A portion of the light is transmitted toward the peripheral side 126 of the light transferring layer 120. The light goes toward the peripheral side 126 of the light transferring layer 120 will be bounced back because of the shielding effect and reflection of the white wall 140. The light that is substantially parallel to the light transferring layer 120 (i.e., lateral light) is reflected to prevent light having deviated colour temperature from leaking. As a result, the light angle emitted from the light emitting diode can be nearly perpendicular or perpendicular to the light transferring layer 120. In the presence of the white wall 140, the lateral light that has slightly varied colour temperature can be blocked. The emitted light has less colour difference like the blue-yellow ring effect.

Figure 2:
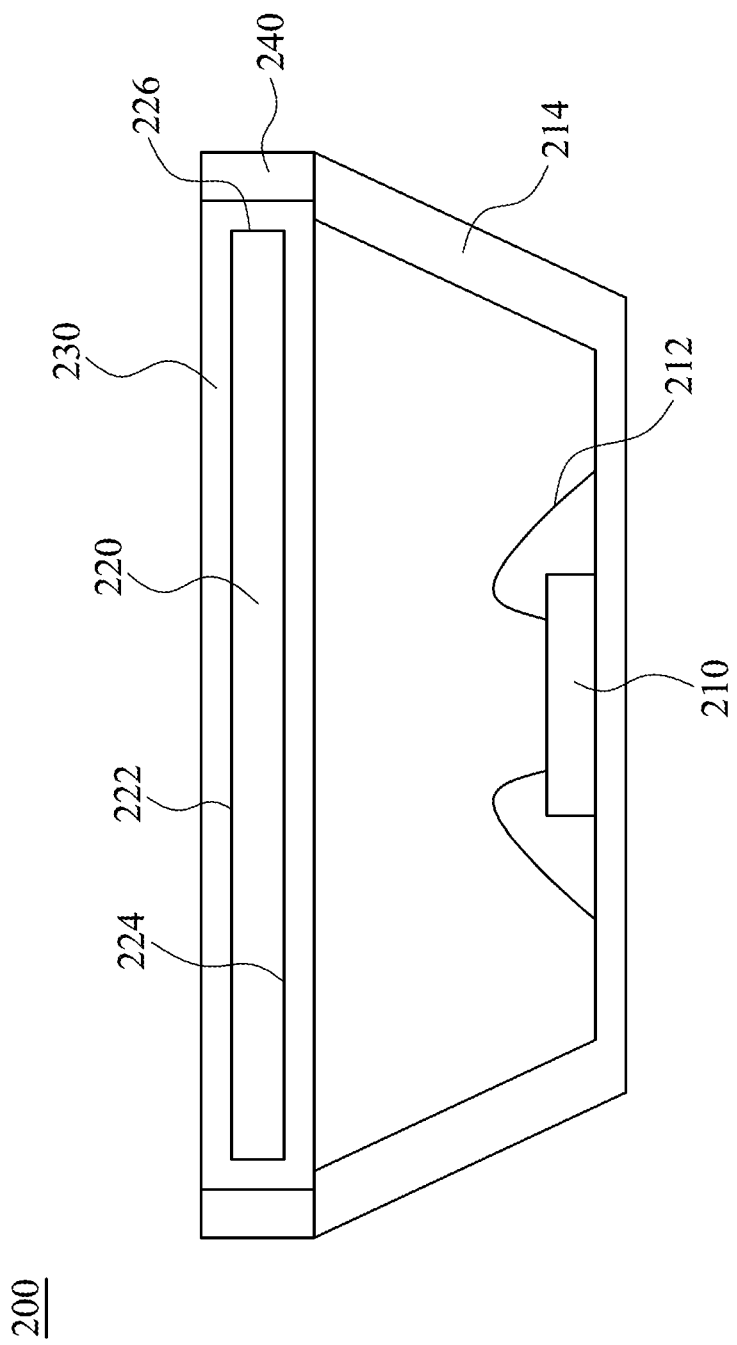
FIG. 2 is a cross-sectional elevation view of a light emitting diode package in accordance with an embodiment of the instant disclosure.

Please refer to FIG. 2. FIG. 2 is a cross-sectional elevation view of a light emitting diode package 200 in accordance with an embodiment of the instant disclosure. The light emitting diode package 200 includes a light element 210, wires 212, a packaging cup 214, a light transferring layer 220, a packaging layer 230 and a white wall 240. The light element 210 may be a light emitting diode and is electrically connected to the chip through wires 212 or any other suitable method.

The light element 210 of the light emitting diode package 200 is disposed on the bottom of the packaging cup 214. The difference between the light emitting diode package 100 and 200 arises from the packaging layer 230 of the light emitting diode package 200. As shown in FIG. 2, the packaging layer 230 encloses the light inlet and outlet face 222, 224 and peripheral side 226 of the light transferring layer 220. The opening of the packaging cup 214 is sealed by the packaging layer 230 that encloses the light transferring layer 220. The white wall 240 is disposed on either side of the packaging layer 230. The height of the white wall 240 is equivalent to a collective thickness of packaging layer 230 and the light transferring layer 220. The white wall 240 is in direct contact with the packaging layer 230, and the relative spatial relationship is still on the peripheral side 226 of the light transferring layer 220.

When the light emitting diode emits light, the propagation of light travels to the closed space, the packaging layer 230 and then the light transferring layer 220. A portion of the light is perpendicular to the light transferring layer 220 and emitted from the light outlet face 222. A portion of the light is emitted through an angle smaller than 90° measured from the light transferring layer 220. A portion of the light is transmitted toward the peripheral side 226 of the light transferring layer 220. The light goes toward the peripheral side 226 of the light transferring layer 220 will be bounced back because of the shielding effect and reflection of the white wall 240. The light that is substantially parallel to the light transferring layer 220 (i.e., lateral light) is reflected to prevent light having deviated colour temperature from leaking. As a result, the light emitted by the light emitting diode package 200 has similar colour temperature. The light having deviated colour temperature is blocked by the white wall 240, and light unevenness is greatly reduced.

Figure 3:
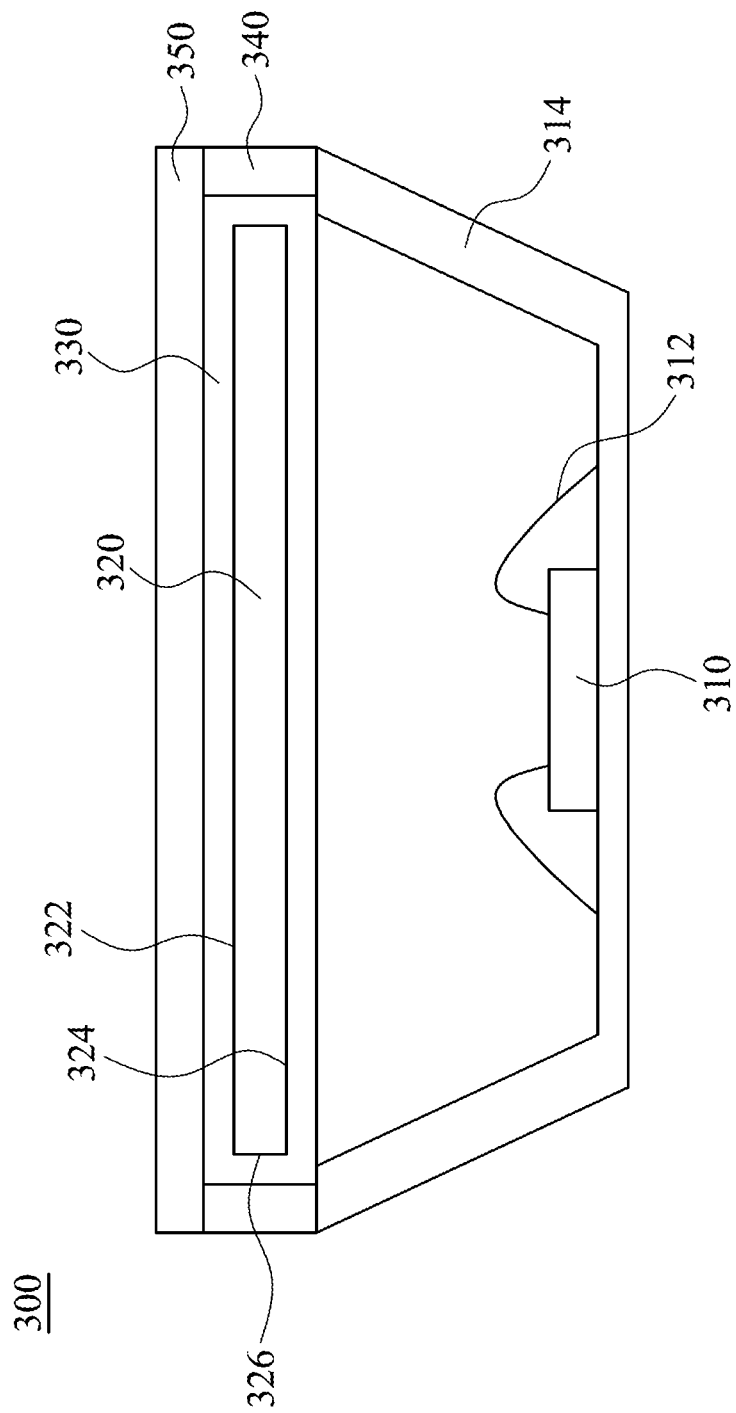
FIG. 3 is a cross-sectional elevation view of a light emitting diode package in accordance with an embodiment of the instant disclosure.

Please refer to FIG. 3. FIG. 3 is a cross-sectional elevation view of a light emitting diode package 300 in accordance with an embodiment of the instant disclosure. The light emitting diode package 300 includes a light element 310, wires 312, a packaging cup 314, a light transferring layer 320, a packaging layer 330, a white wall 340 and a diffusion layer 350. The light element 310 may be a light emitting diode and is electrically connected to the chip through wires 312 or any other suitable method.

The light element 310 of the light emitting diode package 300 is disposed on the bottom of the packaging cup 314. The difference between the light emitting diode package 300 and 200 arises from the diffusion layer 350 of the light emitting diode package 300. As shown in FIG. 3, the opening of the packaging cup 314 is sealed by the packaging layer 330 that encloses the light transferring layer 320. The white wall 340 is disposed on either side of the packaging layer 330, corresponding to the peripheral side 326 of the light transferring layer 320. The height of the white wall 340 is equivalent to a collective thickness of packaging layer 330 and the light transferring layer 320. The white wall 340 is coplanar with the packaging layer 330. The diffusion layer 350 is disposed on the flat face formed by the white wall 340 and the packaging layer 330. The diffusion layer 350 is capable of changing the propagation of light. The diffusion layer 350 is formed on the white wall 340 and the packaging layer 330 by spreading or attachment. The material of the diffusion layer 350 may be polymer having filling particles. Polymer may be material allowing light permeability, for example, PMMA, PET, PS, PP, PA, PC, epoxy, silicon or a combination thereof. The filling particles may be, for example, $TiO_2$, $SiO_2$, $Al_2O_3$, BN, ZnO or the like. The filling particles may include one or more different compounds as a composite, and their particle size may vary.

When the light emitting diode emits light, the propagation of light travels to the closed space, the packaging layer 330 and then the light inlet face 324 of the light transferring layer 320. A portion of the light is perpendicular to the light transferring layer 320 and emitted from the light outlet face 322 and the packaging layer 330. Finally the light goes through the diffusion layer 350 to the environment. A portion of the light is emitted through an angle smaller than 90° measured from the light transferring layer 320. A portion of the light is transmitted toward the peripheral side 326 of the light transferring layer 320. The light goes toward the peripheral side 326 of the light transferring layer 220 will be bounced back because of the shielding effect and reflection of the white wall 340. The light that is substantially parallel to the light transferring layer 320 (i.e., lateral light) is reflected to prevent light having deviated colour temperature from leaking. As a result, the light emitted by the light emitting diode package 300 has similar colour temperature. The lateral light having deviated colour temperature is blocked by the white wall 340. Other normal light is further modified by the diffusion layer 350 and then to the environment. The colour variation caused by different colour temperature is reduced, and light unevenness is minimized.

Figure 4:
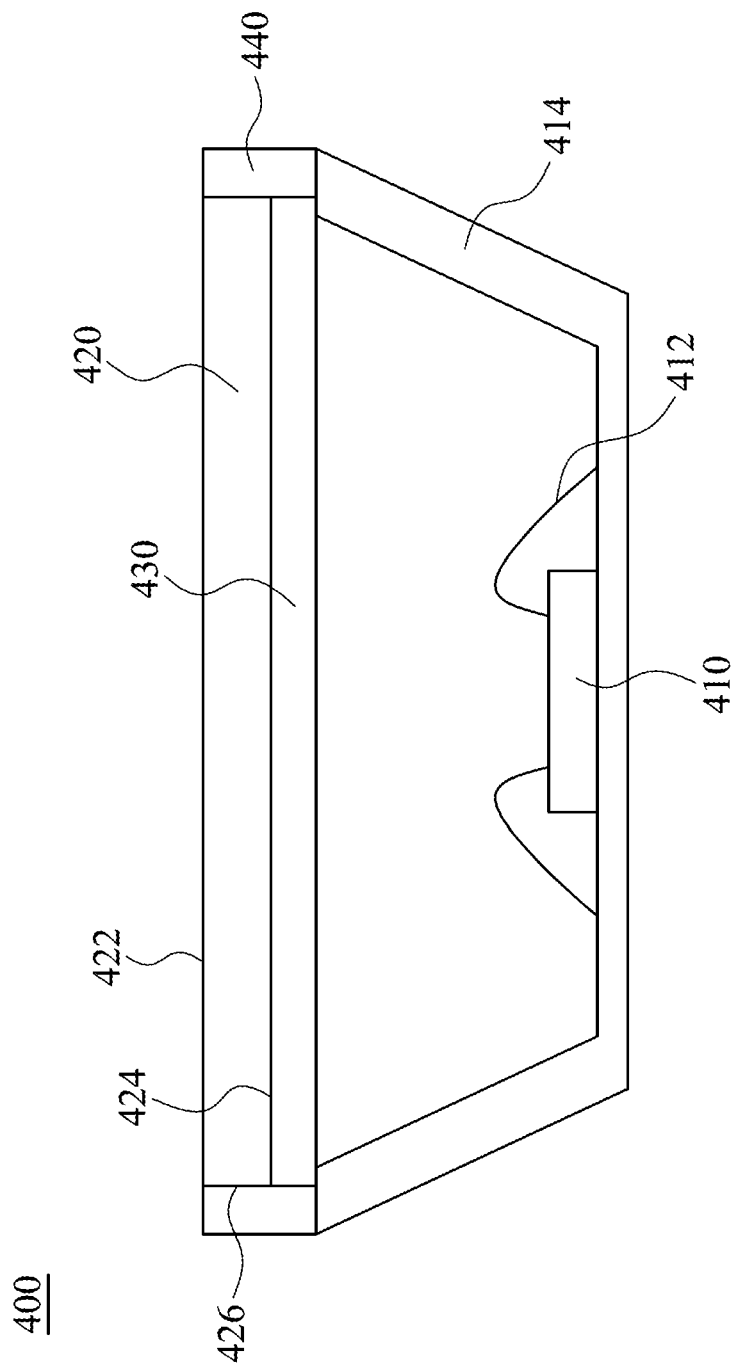
FIG. 4 is a cross-sectional elevation view of a light emitting diode package in accordance with an embodiment of the instant disclosure.

Please refer to FIG. 4. FIG. 4 is a cross-sectional elevation view of a light emitting diode package 400 in accordance with an embodiment of the instant disclosure. The light emitting diode package 400 includes a light element 410, wires 412, a packaging cup 414, a light transferring layer 420, a packaging layer 430 and a white wall 440. The light element 410 may be a light emitting diode and is electrically connected to the chip through wires 412 or any other suitable method.

The light element 410 of the light emitting diode package 400 is disposed on the bottom of the packaging cup 414. The difference between the light emitting diode package 400 and 200 arises from the deposition of the packaging layer 430. The packaging layer 430 of the light emitting diode package 400 is disposed on the light inlet face 424 of the light transferring layer 420, and the packaging layer 430 does not enclose the light transferring layer 420. As shown in FIG. 4, the opening of the packaging cup 414 is sealed by the packaging layer 430. The light transferring layer 420 is disposed on the packaging layer 430. The light inlet face 424 of the light transferring layer 420 is in contact with the packaging layer 430. The light outlet face 422 is not covered by the packaging layer 430. The white wall 440 is disposed on the peripheral side 426 of the light transferring layer 420 and either side of the packaging layer 430. The height of the white wall 440 is equivalent to a collective thickness of packaging layer 430 and the light transferring layer 420. The white wall 240 is coplanar with the light outlet face 422 of the light transferring layer 420.

When the light emitting diode emits light, the propagation of light travels to the closed space, the packaging layer 430 and then the light inlet face 424 of the light transferring layer 420. A portion of the light is perpendicular to the light transferring layer 420 and emitted from the light outlet face 422. A portion of the light is emitted through an angle smaller than 90° measured from the light transferring layer 420. A portion of the light is transmitted toward the peripheral side 426 of the light transferring layer 420. The light goes toward the peripheral side 426 of the light transferring layer 420 will be bounced back because of the shielding effect and reflection of the white wall 440. The light that is substantially parallel to the light transferring layer 420 (i.e., lateral light) is reflected to prevent light having deviated colour temperature from leaking. As a result, the light emitted by the light emitting diode package 400 has similar colour temperature. The light having deviated colour temperature is blocked by the white wall 440, and light unevenness is greatly reduced.

In some embodiments of the instant disclosure, the deposition of laterally enclosing white wall has many advantages. For example, the lateral light that is parallel with the light transferring layer or the packaging layer is bounced back by the white wall. Light having lower colour temperature is prevented from leaking the device, and light unevenness can be greatly reduced. The diffusion layer that is disposed on the light transferring layer can fine tune the emission light optical effect by its special optical property. The white wall can be applied to varied light emitting diode structure without the complex design of secondary light optics. The white wall can be broadly adapted to various types of light emitting diode package.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A light emitting diode package, comprising:
   a light element;
   a packaging cup for accommodating the light element, the packaging cup having an opening;
   a light transferring layer disposed on the packaging cup and sealing the opening to define a closed space therebetween, the light transferring layer having a light outlet face, a light inlet side opposite to the light outlet face and a peripheral side, and the light inlet face facing to the light element;
   a packaging layer enclosing the light transferring layer, the packaging layer covering the light outlet face, the light inlet face and the peripheral side of the light transferring layer;
   a white wall disposed on the packaging cup and surrounding the packaging layer corresponding to the peripheral side of the light transferring layer, the white wall having a thickness the same as a combined thickness of the packaging layer and the light transferring layer; and
   a diffusion film disposed on the packaging layer and white wall.

2. The light emitting diode package of claim 1, wherein the packaging layer covers the light inlet face of the light transferring layer.

3. The light emitting diode package of claim 2, wherein the white wall surrounds the packaging layer and the peripheral side of the light transferring layer.

4. The light emitting diode package of claim 1, wherein the light transferring layer comprises quantum dots (QDs) light emitting material.

5. The light emitting diode package of claim 1, wherein a material of the white wall is selected from glass, quartz, light reflection film, plastic polymer and a combination thereof.

6. The light emitting diode package of claim 1, wherein the light element is a light emitting diode.

7. The light emitting diode package of claim 6, wherein the light emitting diode is chips on board (COB) or plastic leaded chip carrier (PLCC).

* * * * *